United States Patent
Loboda et al.

(10) Patent No.: US 9,797,064 B2
(45) Date of Patent: Oct. 24, 2017

(54) METHOD FOR GROWING A SIC CRYSTAL BY VAPOR DEPOSITION ONTO A SEED CRYSTAL PROVIDED ON A SUPPORT SHELF WHICH PERMITS THERMAL EXPANSION

(71) Applicant: Dow Corning Corporation, Midland, MI (US)

(72) Inventors: Mark Loboda, Bay City, MI (US);
Roman Drachev, Midland, MI (US);
Darren Hansen, Midland, MI (US);
Edward Sanchez, Midland, MI (US)

(73) Assignee: DOW CORNING CORPORATION, Midland, MI (US)

( * ) Notice: Subject to any disclaimer, the term of this patent is extended or adjusted under 35 U.S.C. 154(b) by 198 days.

(21) Appl. No.: 14/058,167

(22) Filed: Oct. 18, 2013

(65) Prior Publication Data
US 2014/0220296 A1    Aug. 7, 2014

Related U.S. Application Data

(60) Provisional application No. 61/761,171, filed on Feb. 5, 2013.

(51) Int. Cl.
*C30B 23/02* (2006.01)
*C30B 29/36* (2006.01)
(Continued)

(52) U.S. Cl.
CPC .......... *C30B 23/025* (2013.01); *C30B 23/005* (2013.01); *C30B 29/36* (2013.01);
(Continued)

(58) Field of Classification Search
CPC ......... C30B 23/00; C30B 23/02; C30B 23/06; C30B 23/005; C30B 23/025; C30B 29/00;
(Continued)

(56) References Cited

U.S. PATENT DOCUMENTS 2,854,364 A   9/1958   Lely
3,691,694 A   9/1972   Goetz et al.
(Continued)

FOREIGN PATENT DOCUMENTS

CN    1643188 A    7/2005
CN    101072901 A   11/2007
(Continued)

OTHER PUBLICATIONS

International Application No. PCT/US2013/077189, International Search Report and Written Opinion, Mar. 21, 2014; 16 pages.
(Continued)

*Primary Examiner* — Kenneth A Bratland, Jr.
(74) *Attorney, Agent, or Firm* — Womble Carlyle Sandridge & Rice LLP; Joseph Bach, Esq.

(57) ABSTRACT

A method of forming an SiC crystal including placing in an insulated graphite container a seed crystal of SiC, and supporting the seed crystal on a shelf, wherein cushion rings contact the seed crystal on a periphery of top and bottom surfaces of the seed crystal, and where the graphite container does not contact a side surface of the seed crystal; placing a source of Si and C atoms in the insulated graphite container, where the source of Si and C atoms is for transport to the seed crystal to grow the SiC crystal; placing the graphite container in a furnace; heating the furnace; evacuating the furnace; filling the furnace with an inert gas; and maintaining the furnace to support crystal growth to thereby form the SiC crystal.

9 Claims, 4 Drawing Sheets

(51) Int. Cl.
*C30B 23/00* (2006.01)
*H01L 21/02* (2006.01)
*H01L 29/16* (2006.01)

(52) U.S. Cl.
CPC .... *H01L 21/02005* (2013.01); *H01L 29/1608* (2013.01); *Y10T 428/24273* (2015.01)

(58) Field of Classification Search
CPC ... C30B 29/10; C30B 29/36; H01L 21/02005; H01L 29/1608; Y10T 428/24273
USPC .......... 117/84, 106–107, 109, 902, 911, 937, 117/951, 200, 204, 102
See application file for complete search history.

(56) References Cited

U.S. PATENT DOCUMENTS

| | | |
|---|---|---|
| 4,582,561 A | 4/1986 | Loku et al. |
| 4,855,254 A | 8/1989 | Eshita et al. |
| 4,866,005 A | 9/1989 | Davis et al. |
| 4,912,063 A | 3/1990 | Davis et al. |
| 4,912,064 A | 3/1990 | Kong et al. |
| 5,192,987 A | 3/1993 | Khan et al. |
| 5,248,385 A | 9/1993 | Powell |
| 5,416,465 A | 5/1995 | Lin |
| 5,679,153 A | 10/1997 | Dmitriev et al. |
| 5,709,745 A | 1/1998 | Larkin et al. |
| 5,751,055 A | 5/1998 | Maruyama et al. |
| 5,888,887 A | 3/1999 | Li et al. |
| 5,895,583 A | 4/1999 | Augustine et al. |
| 5,899,743 A | 5/1999 | Kai et al. |
| 5,942,445 A | 8/1999 | Kato et al. |
| 5,944,890 A | 8/1999 | Kitou et al. |
| 5,954,881 A | 9/1999 | Burk, Jr. et al. |
| 6,196,901 B1 | 3/2001 | Minami |
| 6,214,108 B1 | 4/2001 | Okamoto et al. |
| 6,261,931 B1 | 7/2001 | Keller et al. |
| 6,336,971 B1 | 1/2002 | Nagato et al. |
| 6,352,927 B2 | 3/2002 | Kishimoto |
| 6,406,539 B1 | 6/2002 | Shigeto et al. |
| 6,491,836 B1 | 12/2002 | Kato et al. |
| 6,534,026 B2 * | 3/2003 | Vodakov .................. C01B 31/36 117/951 |
| 6,562,127 B1 | 5/2003 | Kud et al. |
| 6,579,359 B1 | 6/2003 | Mynbaeva et al. |
| 6,583,050 B2 | 6/2003 | Wenski et al. |
| 6,723,166 B2 | 4/2004 | Kuhn et al. |
| 6,786,969 B2 | 9/2004 | Kondo et al. |
| 6,827,638 B2 | 12/2004 | Kiuchi et al. |
| 6,861,360 B2 | 3/2005 | Wenski et al. |
| 6,899,762 B2 | 5/2005 | Wenski et al. |
| 7,064,073 B1 | 6/2006 | U'ren |
| 7,081,420 B2 | 7/2006 | Kamata et al. |
| 7,294,324 B2 | 11/2007 | Powell et al. |
| 7,314,520 B2 | 1/2008 | Powell et al. |
| 7,314,521 B2 | 1/2008 | Powell et al. |
| 7,316,747 B2 | 1/2008 | Jenny et al. |
| 7,323,051 B2 | 1/2008 | Hobgood et al. |
| 7,399,217 B1 | 7/2008 | Godshall |
| 7,422,634 B2 | 9/2008 | Powell et al. |
| 7,438,760 B2 | 10/2008 | Bauer et al. |
| 7,449,065 B1 | 11/2008 | Powell et al. |
| 7,513,819 B2 | 4/2009 | Kiuchi et al. |
| 7,531,433 B2 | 5/2009 | Ellison et al. |
| 7,935,614 B2 | 5/2011 | Schauer et al. |
| 8,075,647 B2 | 12/2011 | Kawasaki et al. |
| 8,165,706 B2 | 4/2012 | Pitney |
| 8,221,549 B2 | 7/2012 | Maruyama |
| 8,384,090 B2 | 2/2013 | Powell et al. |
| 8,395,164 B2 | 3/2013 | Murphy et al. |
| 8,409,351 B2 | 4/2013 | Robbins et al. |
| 8,435,866 B2 | 5/2013 | Nishiguchi et al. |
| 8,436,366 B2 | 5/2013 | Harada et al. |
| 8,716,718 B2 | 5/2014 | Momose et al. |
| 8,860,040 B2 | 10/2014 | Loboda et al. |
| 2002/0083892 A1 * | 7/2002 | Kondo .................. C30B 23/00 117/109 |
| 2003/0070611 A1 | 4/2003 | Nakamura et al. |
| 2004/0081805 A1 | 4/2004 | Furihata et al. |
| 2004/0134418 A1 | 7/2004 | Hirooka |
| 2004/0266057 A1 | 12/2004 | Nagasawa |
| 2005/0059247 A1 | 3/2005 | Ikenaka |
| 2006/0042540 A1 | 3/2006 | Futatsuyama et al. |
| 2006/0102068 A1 | 5/2006 | Tsvetkov et al. |
| 2006/0107890 A1 | 5/2006 | Hobgood et al. |
| 2006/0118037 A1 | 6/2006 | Powell et al. |
| 2006/0180077 A1 | 8/2006 | Suda et al. |
| 2006/0249073 A1 | 11/2006 | Asaoka et al. |
| 2006/0267024 A1 | 11/2006 | Murphy et al. |
| 2006/0289873 A1 | 12/2006 | Rowland et al. |
| 2007/0051979 A1 | 3/2007 | Kambayashi et al. |
| 2007/0176531 A1 * | 8/2007 | Kinoshita .......... C09K 11/0883 313/486 |
| 2007/0221614 A1 | 9/2007 | Sumakeris |
| 2007/0262322 A1 | 11/2007 | Nakabayashi et al. |
| 2007/0290211 A1 | 12/2007 | Nakayama et al. |
| 2008/0008641 A1 * | 1/2008 | Leonard .................. C30B 29/36 423/345 |
| 2008/0217627 A1 | 9/2008 | Friedrichs et al. |
| 2008/0220620 A1 | 9/2008 | Kawada et al. |
| 2008/0261401 A1 | 10/2008 | Kerr et al. |
| 2008/0318359 A1 | 12/2008 | Yonezawa et al. |
| 2009/0038541 A1 | 2/2009 | Robbins et al. |
| 2009/0085044 A1 | 4/2009 | Ohno et al. |
| 2009/0114148 A1 | 5/2009 | Stahlbush et al. |
| 2009/0124060 A1 | 5/2009 | Nagaya et al. |
| 2009/0134405 A1 | 5/2009 | Ota et al. |
| 2009/0302328 A1 | 12/2009 | Ohno et al. |
| 2009/0321747 A1 | 12/2009 | Murphy et al. |
| 2009/0324896 A1 | 12/2009 | Kato |
| 2010/0031877 A1 | 2/2010 | Gupta et al. |
| 2010/0080956 A1 * | 4/2010 | Fujimoto ................ C30B 23/00 428/141 |
| 2010/0119849 A1 | 5/2010 | Nakamura et al. |
| 2010/0291756 A1 | 11/2010 | Haeberlen et al. |
| 2010/0295059 A1 | 11/2010 | Fujimoto et al. |
| 2011/0031505 A1 | 2/2011 | Harada et al. |
| 2011/0056434 A1 | 3/2011 | Yamaguchi et al. |
| 2011/0089431 A1 | 4/2011 | Yagi et al. |
| 2011/0146565 A1 | 6/2011 | Ishibashi et al. |
| 2011/0206929 A1 | 8/2011 | Nakabayashi et al. |
| 2011/0233562 A1 | 9/2011 | Harada et al. |
| 2011/0237078 A1 | 9/2011 | Hirooka |
| 2011/0266556 A1 | 11/2011 | Leonard et al. |
| 2011/0284871 A1 | 11/2011 | Harada et al. |
| 2011/0306212 A1 | 12/2011 | Sato et al. |
| 2012/0025153 A1 | 2/2012 | Hirose et al. |
| 2012/0031330 A1 | 2/2012 | Tsumori et al. |
| 2012/0060751 A1 | 3/2012 | Urakami et al. |
| 2012/0061686 A1 | 3/2012 | Nishiguchi et al. |
| 2012/0070605 A1 | 3/2012 | Sasaki et al. |
| 2012/0070968 A1 | 3/2012 | Shibagaki et al. |
| 2012/0103249 A1 | 5/2012 | Gupta et al. |
| 2012/0114545 A1 | 5/2012 | Loboda et al. |
| 2012/0128892 A1 | 5/2012 | Toyoda et al. |
| 2012/0184113 A1 | 7/2012 | Inoue et al. |
| 2012/0241766 A1 | 9/2012 | Ohtsuka et al. |
| 2012/0248463 A1 | 10/2012 | Zhang |
| 2012/0280254 A1 | 11/2012 | Muto et al. |
| 2012/0285370 A1 | 11/2012 | Gupta et al. |
| 2013/0020585 A1 | 1/2013 | Ishibashi |
| 2013/0029158 A1 | 1/2013 | Aigo et al. |
| 2013/0032822 A1 | 2/2013 | Ishibashi |
| 2013/0071643 A1 | 3/2013 | Harada et al. |
| 2013/0099253 A1 | 4/2013 | Ohtsuka et al. |
| 2013/0122692 A1 | 5/2013 | Imai et al. |
| 2013/0126906 A1 | 5/2013 | Tomita et al. |
| 2013/0130593 A1 | 5/2013 | Kalenian et al. |
| 2013/0171402 A1 * | 7/2013 | Straubinger .......... C30B 23/02 428/64.1 |
| 2013/0327265 A1 | 12/2013 | Inoue et al. |
| 2014/0021481 A1 | 1/2014 | Lee et al. |

(56) References Cited

U.S. PATENT DOCUMENTS

| | | |
|---|---|---|
| 2014/0054619 A1 | 2/2014 | Burk et al. |
| 2014/0220296 A1 | 8/2014 | Loboda et al. |
| 2014/0220298 A1 | 8/2014 | Loboda |

FOREIGN PATENT DOCUMENTS

| | | |
|---|---|---|
| CN | 101155640 A | 4/2008 |
| CN | 101155676 A | 4/2008 |
| CN | 101490315 A | 7/2009 |
| CN | 101599428 A | 12/2009 |
| CN | 101724344 | 6/2010 |
| CN | 101802273 A | 8/2010 |
| CN | 102107391 | 6/2011 |
| CN | 102187019 | 9/2011 |
| CN | 102187019 A | 9/2011 |
| CN | 102257190 A | 11/2011 |
| CN | 102272351 A | 12/2011 |
| CN | 102484044 A | 5/2012 |
| CN | 102569055 | 7/2012 |
| CN | 102656297 A | 9/2012 |
| CN | 102714143 A | 10/2012 |
| CN | 102859654 A | 1/2013 |
| CN | 102899723 | 1/2013 |
| DE | 102009016132 | 10/2010 |
| DE | 102010029755 A1 | 12/2011 |
| EP | 0712150 | 5/1996 |
| EP | 0795050 | 7/1999 |
| EP | 0967304 | 12/1999 |
| EP | 1039512 | 3/2000 |
| EP | 1179620 | 2/2002 |
| EP | 0954623 | 5/2002 |
| EP | 1215730 | 6/2002 |
| EP | 1225257 | 7/2002 |
| EP | 1288346 | 8/2002 |
| EP | 1255281 | 11/2002 |
| EP | 1306890 | 5/2003 |
| EP | 1354987 | 10/2003 |
| EP | 1403404 | 3/2004 |
| EP | 1143033 | 9/2004 |
| EP | 1491662 | 12/2004 |
| EP | 1243674 | 6/2005 |
| EP | 1659198 | 5/2006 |
| EP | 1739726 | 1/2007 |
| EP | 1785512 | 5/2007 |
| EP | 1852527 | 11/2007 |
| EP | 1855312 | 11/2007 |
| EP | 1751329 | 1/2008 |
| EP | 1901345 | 3/2008 |
| EP | 1828446 | 3/2010 |
| EP | 1721031 | 11/2010 |
| EP | 2264223 | 12/2010 |
| EP | 2314737 | 4/2011 |
| EP | 1752567 | 9/2011 |
| EP | 2371997 | 10/2011 |
| EP | 2385158 | 11/2011 |
| EP | 2394787 | 12/2011 |
| EP | 2395133 | 12/2011 |
| EP | 2405038 | 1/2012 |
| EP | 2420599 | 2/2012 |
| EP | 2484815 | 8/2012 |
| EP | 2490247 | 8/2012 |
| EP | 2557205 | 2/2013 |
| EP | 1797225 | 3/2013 |
| EP | 2570522 | 3/2013 |
| EP | 2584594 | 4/2013 |
| EP | 1790757 | 8/2013 |
| EP | 2653591 A1 | 10/2013 |
| JP | H04-223330 A | 8/1992 |
| JP | H05-262599 | 10/1993 |
| JP | H06-5567 A | 1/1994 |
| JP | H06-316499 | 11/1994 |
| JP | 10-50616 A | 2/1998 |
| JP | 11-121311 A | 4/1999 |
| JP | 11-135464 A | 5/1999 |
| JP | 2000-235941 A | 8/2000 |
| JP | 2001-508597 A | 6/2001 |
| JP | 2001-291690 A | 10/2001 |
| JP | 2002-134375 A | 5/2002 |
| JP | 2003086518 | 3/2003 |
| JP | 2003086816 | 3/2003 |
| JP | 2003-249426 A | 9/2003 |
| JP | 2004099340 | 4/2004 |
| JP | 2004-299018 A | 10/2004 |
| JP | 2004292305 | 10/2004 |
| JP | 2005051299 | 2/2005 |
| JP | 2005-508086 A | 3/2005 |
| JP | 2005064392 | 3/2005 |
| JP | 2006-32655 A | 2/2006 |
| JP | 2006066722 | 3/2006 |
| JP | 2006120897 | 5/2006 |
| JP | 2006-143511 A | 6/2006 |
| JP | 2006-245128 A | 9/2006 |
| JP | 3854508 B2 | 12/2006 |
| JP | 2007-002268 A | 1/2007 |
| JP | 2007080770 | 3/2007 |
| JP | 2007131504 | 5/2007 |
| JP | 2007230823 | 9/2007 |
| JP | 2008001537 | 1/2008 |
| JP | 2008004888 | 1/2008 |
| JP | 2008-053178 A | 3/2008 |
| JP | 2008053343 | 3/2008 |
| JP | 2008-074664 A | 4/2008 |
| JP | 2008-091656 A | 4/2008 |
| JP | 2008074661 | 4/2008 |
| JP | 2008115034 | 5/2008 |
| JP | 2008-235740 A | 10/2008 |
| JP | 2008-538542 A | 10/2008 |
| JP | 2008-311541 A | 12/2008 |
| JP | 2009-081186 A | 4/2009 |
| JP | 2009-088223 A | 4/2009 |
| JP | 2009182126 | 8/2009 |
| JP | 2009-256146 A | 11/2009 |
| JP | 2009-295728 A | 12/2009 |
| JP | 2010-029995 A | 2/2010 |
| JP | 2010-045279 A | 2/2010 |
| JP | 2010-95397 A | 4/2010 |
| JP | 2010-510946 A | 4/2010 |
| JP | 2010-99830 A | 5/2010 |
| JP | 2010-109151 A | 5/2010 |
| JP | 2010-135789 A | 6/2010 |
| JP | 2010228939 | 10/2010 |
| JP | 2010-254521 A | 11/2010 |
| JP | 2010254520 | 11/2010 |
| JP | 2011-020860 | * 2/2011 |
| JP | 2011020860 | 2/2011 |
| JP | 2011073915 | 4/2011 |
| JP | 2011-121847 A | 6/2011 |
| JP | 2011-122102 A | 6/2011 |
| JP | 2011-219297 A | 11/2011 |
| JP | 2011233932 | 11/2011 |
| JP | 2011-243619 A | 12/2011 |
| JP | 2011-254119 A | 12/2011 |
| JP | 4845142 B2 | 12/2011 |
| JP | 4850960 B2 | 1/2012 |
| JP | 2012028565 | 2/2012 |
| JP | 2012-051795 A | 3/2012 |
| JP | 2012-114210 A | 6/2012 |
| JP | 2012246168 | 12/2012 |
| JP | 2013014469 | 1/2013 |
| JP | 2013-023399 A | 2/2013 |
| KR | 10-1999-0087978 A | 12/1999 |
| KR | 10-2002-0032355 A | 5/2002 |
| KR | 10-2004-0097175 A | 11/2004 |
| KR | 10-2007-0063150 A | 6/2007 |
| KR | 10-2007-0073954 A | 7/2007 |
| KR | 10-2008-0007165 A | 1/2008 |
| KR | 100845946 | 7/2008 |
| KR | 10-2009-0031573 A | 3/2009 |
| KR | 10-2010-0096999 A | 9/2010 |
| KR | 10-2012-0061920 A | 6/2012 |
| KR | 10-2012-0101087 A | 9/2012 |
| KR | 10-2012-0101097 A | 9/2012 |
| WO | WO 9301914 | 2/1993 |
| WO | WO 9713013 | 4/1997 |

(56) References Cited

FOREIGN PATENT DOCUMENTS

| WO | WO 0068474 | 11/2000 |
|---|---|---|
| WO | WO 0079570 | 12/2000 |
| WO | 01/18872 A1 | 3/2001 |
| WO | WO 0218670 | 3/2002 |
| WO | WO 2004014607 | 2/2004 |
| WO | 2004/092453 A2 | 10/2004 |
| WO | WO 2005111277 | 11/2005 |
| WO | WO 2006031641 | 3/2006 |
| WO | WO 2006108191 | 10/2006 |
| WO | WO 2006135476 | 12/2006 |
| WO | WO 2007035570 | 3/2007 |
| WO | WO 2007058774 | 5/2007 |
| WO | WO 2007148486 | 12/2007 |
| WO | WO 2008033994 | 3/2008 |
| WO | WO 2008039914 | 4/2008 |
| WO | WO 2009003100 | 12/2008 |
| WO | 2009/035095 A1 | 3/2009 |
| WO | WO 2009075935 | 6/2009 |
| WO | WO 2009080177 | 7/2009 |
| WO | WO 2009120505 | 10/2009 |
| WO | WO 2010041497 | 4/2010 |
| WO | WO 2010111473 | 9/2010 |
| WO | 2010/119792 A1 | 10/2010 |
| WO | WO 2011034850 | 3/2011 |
| WO | 2011/074453 A1 | 6/2011 |
| WO | WO 2011/083552 | 7/2011 |
| WO | WO 2011126145 | 10/2011 |
| WO | WO 2011/142074 | 11/2011 |
| WO | WO 2011149906 | 12/2011 |
| WO | WO 2012026234 | 3/2012 |
| WO | WO 2012067112 | 5/2012 |
| WO | WO 2012144614 | 10/2012 |
| WO | WO 2013062380 | 5/2013 |

OTHER PUBLICATIONS

International Application No. PCT/US2013/077285, International Search Report and Written Opinion, Apr. 7, 2014; 15 pages.

International Application No. PCT/US2013/077291, International Search Report and Written Opinion, Apr. 4, 2014; 16 pages.

Chen, Y., et al. "Studies of the Distribution of Elementary Threading Screw Dislocations in 4H Silicon Carbide Wafer." Materials Science Forum 600-603 (2007): 301-304.

Chung, G., et al. "4H—SiC Epitaxy with Very Smooth Surface and Low Basal Plane Dislocation on 4 Degree Off-Axis Wafer." Materials Science Forum 679-680 (2011): 123-126.

Dmitriev, V., et al. "Growth of SiC and SiC—AlN solid solution by container-free liquid phase epitaxy." Journal of crystal growth 128.1 (1993): 343-348.

Gupta, A., et al. "Status of Large Diameter SiC Single Crystals." Materials Science Forum 717-720 (2012): 3-8.

Gutkin, M., et al. "Micropipe Reactions in Bulk SiC Growth." Silicon Carbide-Materials, Processing and Applications in Electronic Devices (2011): 187-206.

Hecht, C., et al. "High-Performance Multi-Wafer SiC Epitaxy—First Results of Using a 10×100mm Reactor." Materials Science Forum 645-648 (2010): 89-94.

Hull, B., et al., "Development of Large Area (up to 1.5 cm2) 4H—SiC 10 kV Junction Barrier Schottky Rectifiers." Materials Science Forum 600-603 (2008): 931-934.

Ioffe Physico-Technical Institute. "Electronic archive. New Semiconductor Materials. Characteristics and Properties. NSM Archive—Silicon Carbide (SiC)." http://ioffe.ru/SVA/NSM/Semicond/ accessed Aug. 29, 2013 (1998-2001): 1-72.

Kimoto, T., et al. "Homoepitaxial Growth of 4H—SiC (033¯8) and Nitrogen Doping by Chemical Capor Deposition." Journal of crystal growth 249.1 (2003): 208-215.

Larkin, D., et al. "Site-Competition Epitaxy for Superior Silicon Carbide Electronics." Applied Physics Letters 65.13 (1994): 1659-1661.

Lendenmann, H., et al. "Operation of a 2500V 150A Si-IGBT / SiC Diode Module." Materials Science Forum 338-342 (2000): 1423-1426.

Maximenko, S., et al. "Open Core Dislocations and Surface Energy of SiC." Materials Science Forum 527-529 (2006): 439-442.

Mynbaeva, M., et al. "Chemical Vapor Deposition of 4H—SiC Epitaxial Layers on Porous SiC Substrates."Applied Physics Letters 78.1 (2001): 117-119.

Neudeck, P. "Electrical Impact of SiC Structural Crystal Defects on High Electric Field Devices." Materials Science Forum 338-342 (2000): 1161-1166.

Neudeck, P., et al. "Performance Limiting Micropipe Defects in Silicon Carbide Wafers." Electron Device Letters, IEEE 15.2 (1994): 63-65.

Ogunniyi, A., et al. "The Benefits and Current Progress of SiC SGTOs for Pulsed Power Applications." Solid-State Electronics 54.10 (2010): 1232-1237.

Powell, A., et al. "Large Diameter 4H—SiC Substrates for Commercial Power Applications." Materials Science Forum 457-460 (2004): 41-46.

Powell, J., et al. "Process-Induced Morphological Defects in Epitaxial CVD Silicon Carbide." physica status solidi (b) 202.1 (1997): 529-548.

Powell, J., et al. "Sources of Morphological Defects in SiC Epilayers." Transactions Third International High-Temperature Electronics Conference, Sandia National Laboratories 1 (1996): II-3-II-8.

Sanchez, E., et al. "Thermal Decomposition Cavities in Physical Vapor Transport Grown SiC." Materials Science Forum 338.1 (2000): 55-58.

Schulze, N., et al. "Near-Equilibrium Growth of Micropipe-Free 6H—SiC Single Crystals by Physical Vapor Transport." Applied Physics Letters 72.13 (1998): 1632-1634.

Tairov, Y., et al. "General Principles of Growing Large-Size Single Crystals of Various Silicon Carbide Polytypes." Journal of Crystal Growth 52 (1981): 146-150.

Tairov, Y., et al. "Progress in Controlling the Growth of Polytypic Crystals." Progress in Crystal Growth and Characterization 7.1 (1983): 111-162.

Thomas, B., et al. "Properties and Suitability of 4H—SiC Epitaxial Layers Grown at Different CVD Systems for High Voltage Applications." Materials Science Forum 457-460 (2004): 181-184.

Tupitsyn, E., et al. "Controllable 6H—SiC to 4H—SiC Polytype Transformation During PVT Growth." Journal of Crystal Growth 299.1 (2007): 70-76.

Wagner, G., et al. "Vapour Phase Growth of Epitaxial Silicon Carbide Layers." Progress in Crystal Growth and Characterization of Materials 47.2 (2003): 139-165.

Wan, J., et al. "A Comparative Study of Micropipe Decoration and Counting in Conductive and Semi-Insulating Silicon Carbide Wafers." Journal of Electronic Materials. 34.10 (2005): 1342-1348.

Wan, J., et al. "A New Method of Mapping and Counting Micropipes in SiC Wafers." Materials Science Forum 527-529 (2006): 447-450.

Wan, J., et al. "Scaling of Chlorosilane SiC CVD to Multi-Wafer Epitaxy System." Materials Science Forum 556-557 (2007): 145-148.

Wolf, S., et al. Silicon Processing for the VLSI Era. vol. 1—Process Technology. Ch. 1: Silicon: Single-Crystal Growth and Wafering (1986): 1-35.

Zhou, L., et al. "Chemomechanical Polishing of Silicon Carbide." Journal of the Electrochemical Society 144.6 (1997): L161-L163.

Levinshtein, M., et al. (eds.). Properties of Advanced Semiconductor Materials: GaN, AlN, InN, BN, SiC, SiGe. Ch. 5: Silicon Carbide (SiC) (2001): 93-147.

International Application No. PCT/US2013/059064, International Search Report and Written Opinion, Nov. 18, 2013.

Yashiro, H., et al. "Development of Lapping and Polishing Technologies of 4H—SiC Wafers for Power Device Applications." Materials Science Forum 600-603 (2009): 819-822.

International Application No. PCT/US2013/058996, International Search Report and Written Opinion, Nov. 27, 2013.

(56) References Cited

OTHER PUBLICATIONS

Chen, W., and M. A. Capano. "Growth and characterization of 4H—SiC epilayers on substrates with different off-cut angles." Journal of applied physics 98.11 (2005): 114907.
Kordina et al. "SiC epitaxial growth on larger area substrates: History and evolution", Silicon Carbide Epitaxy, 2012, pp. 1-25.
Hecht et al., "High-performance multi-wafer SiC epitaxy—First results of using a 10×100 mm reactor", Material Science Form, vols. 645-648 (2010), pp. 89-94.
Myers R L et al., "High Epitaxial Growth Rate of 4H—SiC using Horizontal Hot-Wall CVD," *Materials Science Forum Trans Tech Publications Switzerland*, vol. 527-529, 2006, pp. 187-190, XP002728678, ISSN: 0255-5476.
Chen, W., et al., "Growth and characterization of 4H—SiC epilayers on substrates with different off-cut angles." Journal of applied physics 98.11 (2005): 114907.
Chen, X.D., et al., "Deep Level Defect in Si-implanted GaN n+-9 Junction," Applied Physics Letters, vol. 82, No. 21, May 2003, pp. 3671-3673.
Cho, H., et al., "Isolation of AlGaN/GaN HEMTs on Si Substrate Using Argon-Ion Implantation Method," 16th Korea Semiconductor Conference, 2009, pp. 74-75.
Hardin, C.W., et al., "Fixed Abrasive Diamond Wire Saw Slicing of Single-Crystal Silicon Carbide Wafers," Materials and Manufacturing Processses, vol. 19, No. 2, pp. 355-367, 2004.
Komiyama, J., et al., "Suppression of crack generation in GaN epitaxy on Si using cubic SiC as intermediate layers," Applied Physics Letters, vol. 88, No. 9, Feb. 27, 2006.
Oka, T., et al., "AlGaN/GaN Recessed MIS-Gate HFET With High-Threshold-Voltage Normally-Off Operation for Power Electronics Applications," IEEE Electron Device Letters, vol. 29, No. 7, Jul. 2008, pp. 668-670.
Radeker, W.S., et al., "A Hierarchy of Slurry Reprocessing Options," TMS Conference Papers, Feb. 14-18, 2010, Seattle, WA.
Yamamoto, N., et al., "Slicing of rotating SiC ingot by electric discharge machining," Materials Science Forum, Jan. 2013.
Wafer Slicing Technology for Solar Photovoltaic Cells, Applied Materials, Apr. 2011.
International Search Report and Written Opinion in PCT/US2015/015842 dated Jul. 29, 2015.
International Search Report and Written Opinion in PCT/US2015/042590 dated Oct. 16, 2015.
International Preliminary Report on Patentability in PCT/US2014/030022 dated Sep. 24, 2015.
Office Action for Japanese Patent Application No. 2015-523311 dated Jul. 21, 2015.
Office Action for Korean Patent Application No. 10-2015-7013789 dated Jul. 27, 2015.
Final Rejection for Korean Patent Application No. 10-2015-7013789 dated Oct. 12, 2015.
Notice of Reasons for Refusal for Korean Patent Application No. 10-2015-7008990 dated Oct. 7, 2015.
Notice of Allowance in U.S. Appl. No. 14/585,101 dated Oct. 28, 2015.
Notice of Reasons for Rejection for Japanese Patent Application No. 2015-539598 dated Sep. 29, 2015.
Examination Report in European Patent Application No. 13765595.7 dated Oct. 29, 2015.
Second Office Action for Chinese Patent Application No. 201380020805.6 dated Dec. 9, 2015.
Office Action for Korean Patent Application No. 10-2015-7024047 dated Dec. 11, 2015.
Office Action for Japanese Patent Application No. 2015-556941 dated Jan. 12, 2016.
Examination Report for European Patent Application No. 14721146.0 dated Jan. 26, 2016.
Notice of Final Rejection for Korean Patent Application 10-2015-7008990 dated Feb. 2, 2016.
Notice of Reasons for Rejection for Japanese Patent Application No. 2015-523311 dated Jan. 26, 2016.
Decision of Patent Grant for Korean Patent Application No. 10-2015-7008990 dated Mar. 17, 2016.
Office Action for Chinese Patent Application No. 201480002722.9 dated Mar. 14, 2016.
Decision of Patent Grant for Korean Patent Application No. 10-2015-7024047 dated Apr. 28, 2016.
First Office Action for Chinese Patent Application No. 201380060888.1 dated Apr. 7, 2016.
Decision of Refusal for Japanese Patent Application No. 2015-539598 dated May 10, 2016.
Office Action for Chinese Patent Application No. 201380074938.1 dated Apr. 26, 2016.
Pre-Examination Report for Japanese Patent Application No. 2015-510524 dated Apr. 15, 2016.
Decision of Refusal for Japanese Patent Application No. 2015-556941 dated May 31, 2016.
International Search Report and Written Opinion for PCT/US2016/015773 dated May 13, 2016.
Summons to Attend Oral Proceedings for European Patent Application No. 13765595.7 dated Jul. 14, 2016.
Examination Report for European Patent Application No. 13818955.0 dated Aug. 16, 2016.
Office Action for Chinese Patent Application No. 201480002722.9 dated Aug. 29, 2016.
Office Action for Chinese Patent Application No. 201380074938.1 dated Oct. 24, 2016.
Office Action for Japanese Patent Application No. 2015-510524 dated Nov. 8, 2016.
Decision on Appeal for U.S. Appl. No. 13/963,989 dated Dec. 1, 2016.
Tupitsyn, E. Y., et al. "Controllable 6H—SiC to 4H—SiC polytype transformation during PVT growth", Journal of Crystal Growth, vol. 299, pp. 70-76, 2007.

* cited by examiner

METHOD FOR GROWING A SIC CRYSTAL BY VAPOR DEPOSITION ONTO A SEED CRYSTAL PROVIDED ON A SUPPORT SHELF WHICH PERMITS THERMAL EXPANSION

RELATED APPLICATIONS

This application claims priority benefit from U.S. Provisional Application No. 61/761,171, filed on Feb. 5, 2013.

BACKGROUND

1. Field

The disclosed invention relates to manufacturing of silicon carbide (SiC) crystals and wafers.

2. Related Art

Silicon carbide, SiC, is a crystalline semiconductor material, recognized by those familiar with materials science, electronics and physics as being advantageous for its wide band gap properties and also for extreme hardness, high thermal conductivity and chemical inert properties. These properties make SiC a very attractive semiconductor for fabrication of power semiconductor devices, enabling power density and performance enhancement over devices made from more common materials like silicon.

The most common forms of SiC consist of cubic or hexagonal arrangements of atoms. The stacking of Si and C layers can take on many forms, known as polytypes. The type of silicon carbide crystal is denoted by a number denoting the number of repeat units in the stacking sequence followed by a letter representing the crystalline format. For example the 3C—SiC polytype refers to a repeat unit of 3 and a cubic (C) lattice, while a 4H—SiC polytype refers to repeat unit of 4 and a hexagonal (H) lattice.

The different silicon carbide polytypes have some variations in materials properties, most notably electrical properties. The 4H—SiC polytype has the relatively larger bandgap while the 3C—SiC has a smaller bandgap, with the bandgaps for most other polytypes falling in between. For high performance power device applications when the bandgap is larger, the material is more capable, in theory, to offer relatively higher power and thermal conductivity performance.

SiC crystals do not occur in nature and as such must be synthesized. Growth of SiC crystals can be executed by sublimation/physical vapor transport or chemical vapor deposition.

Growth of SiC by sublimation is very challenging. Temperatures in excess of 2,000° C. are required to generate vapor stream of Si/C species by sublimation, which places great limitations on the reaction cell components and the furnace design. Originally SiC abrasive materials formed by processes like the Acheson method were used as the source of the Si and C atoms for the crystal, and as the technology matured groups developed means to synthesize SiC source powder specifically for SiC crystal growth. The growth is usually performed in a graphite container within a vacuum chamber. The graphite container is heated by either resistive methods or induction methods. The container is insulated in a careful manner so as to create controlled temperature gradients within the volume. A seed crystal is used, which is usually shaped like a plate or disc. The seed crystal is typically oriented with its growth surface facing the source material. The location of the seed crystal in the container is designed such that when the container is heated, the seed is at a relatively lower temperature position, while the Si—C source materials are at the higher temperature position. When the container is heated to a temperature sufficient to sublime the source material, the vapors will travel towards the low temperature region and condense on the seed crystal. While this appears simple in concept, in practice the growth of SiC is very complicated and recognized by those who practice as very difficult to perform.

Historically, initial progress in SiC sublimation-based crystal growth is described first by Lely (U.S. Pat. No. 2,854,364) whose method of unseeded crystal growth resulted in small hexagonal SiC platelets. In the 1970s and 1980s the art to produce the first crystals of size attractive for producing devices was done in Russia by Tairov and Tsvetkov (Journal of Crystal Growth, 52 (1981) p. 146-50 and *Progress in Controlling the Growth of Polytypic Crystals in Crystal Growth and Characterization of Polytype Structures*, P. Krishna, ed., Pergammon Press, London, p. 111 (1983)). Their approach used a Lely crystal as a seed, and conducted growth by sublimation and transport as described above. These results showed methods for polytype control by choice of seeds, pressure control and temperature gradients. Later, Davis (U.S. Pat. No. 4,866,005) revealed improvements by judicious selection of source materials and gradient controls. Refinements on the methods of Tairov, Tsvetkov and Davis continue to be revealed to this day.

When methods to produce larger crystals emerged, focus also moved to control defects in the crystals. Defects can be categorized as inclusions and crystal dislocations. The primary crystalline defects in SiC crystals are screw dislocations. Among these are a special case known as a micropipe or hollow core screw dislocations. Additionally, there are basal plane dislocations and threading edge dislocations. These defects originate from many sources. For example, defects contained in the seed crystal can be passed to the newly grown crystal volume. Stresses arising from temperature gradients and thermal expansion mismatch and imparted to the seed and the crystal during growth can result in formation of dislocations. Deviation of the stoichiometry in the sublimation vapor stream from that needed to form SiC can result in unstable polytype growth; in turn leading to polytype inclusions in the grown crystal, which leads to dislocation formation at the polytype boundaries. Even interactions between dislocations can create or eliminate dislocations.

SiC crystals produced by methods identified have large concentrations of dislocations. As of this filing, the commonly reported values of screw dislocation and basal plane concentration are nominally 5,000-10,000/cm$^2$, respectively. The dislocations are most commonly assessed by sectioning the crystal in the plane normal to the crystal axis of symmetry. Etching the exposed crystal surface with molten salt, like potassium hydroxide, at temperatures in the 350-500° C. range will reveal the dislocations. Each dislocation type has a unique shape so they can be uniquely counted. The dislocations are commonly counted and reported as a number divided by the inspection area. This characterization method is useful as it allows for easy correlation of defects contained in planar semiconductor devices formed on the crystal plane. There are many examples in the literature which show that dislocations are not uniformly distributed in the plane of observation. The large count of dislocations makes it very impractical to count every single one, especially as today inspections can be required on sections greater than or equal to the equivalent of 100 mm diameter circles. So the etched area is sampled to determine the amount of dislocations. Incorrect sampling methods can lead to errors in the estimation of the dislocation concentration associated with larger crystals. In most reports, the details of the sampling method are not provided, so replication of reported results can often be difficult, if not impossible.

Scientists experienced in solid state physics and semiconductor devices know that dislocations result in device performance below the theoretical properties of the material. Therefore, modern effort focused on improvements of semiconductor SiC crystal quality look to identify and control the factors which can reduce defects originating in crystal growth.

Once large enough crystals are produced, the crystal must be cut and fabricated into wafers in order to be useful to fabricate semiconductor devices using planar fabrication methods. As many semiconductor crystals (e.g., silicon, gallium arsenide) have been successfully developed and commercialized into wafer products, the methods to fabricate wafers from bulk crystals are known. A review of the common approaches to, and requirements for wafer fabrication and standard methods of characterization, can be found in Wolf and Tauber, Silicon Processing for the VLSI Era, Vol. 1—Process Technology, Chapter 1 (Lattice Press—1986).

Due to its hardness, fabrication of SiC into wafer substrates presents unique challenges compared to processing other common semiconductor crystals like silicon or gallium arsenide. Modifications must be made to the machines and the choices of abrasives changed beyond commonly used materials. It has been reported that substantial subsurface damage is observable on mirror polished SiC wafers, and this can be reduced or removed by using chemical enhanced mechanical polishing methods similar to that used in the silicon industry (Zhou, L., et al., *Chemomechanical Polishing of Silicon Carbide*, J. Electrochem. Soc., Vol. 144, no. 6, June 1997, pp. L161-L163).

In order to build semiconductor devices on SiC wafers additional crystalline SiC films must be deposited on the wafers to create the device active regions with the required conductivity value and conductor type. This is typically done using chemical vapor deposition (CVD) methods. Techniques for growth of SiC by CVD epitaxy have been published from groups in Russia, Japan and the United States since the 1970's. The most common chemistry for growth of SiC by CVD is a mixture of a silicon containing source gas (e.g., monosilanes or chlorosilanes) and a carbon containing source gas (e.g., a hydrocarbon gas). A key element to growth of low defect epitaxial layers is that the substrate surface is tilted away from the crystal axis of symmetry to allow the chemical atoms to attach to the surface in the stacking order established by the substrate crystal. When the tilt is not adequate, the CVD process will produce three dimensional defects on the surface, and such defects will result in non-operational semiconductor devices. Surface imperfections, such as cracks, subsurface damage, pits, particles, scratches or contamination will interrupt the replication of the wafer's crystal structure by the CVD process (see, for example, Powell and Larkin, *Phys. Stat. Sol.* (*b*) 202, 529 (1997)). It is important that the polishing and cleaning processes used to fabricate the wafer minimize surface imperfections. In the presence of these surface imperfections several defects can be generated in the epitaxial films including basal plane dislocations and cubic SiC inclusions (see for example, Powell, et. al. *Transactions Third International High-Temperature Electronics Conference*, Volume 1, pp. II-3-II-8, Sandia National Laboratories, Albuquerque, N. Mex. USA, 9-14 Jun. 1996).

Defects in SiC are known to limit or destroy operation of semiconductor devices formed over the defects. Neudeck and Powell reported that hollow core screw dislocations (micropipes) severely limited voltage blocking performance in SiC diodes (P. G. Neudeck and J. A. Powell, *IEEE Electron Device Letters*, vol. 15, no. 2, pp. 63-65, (1994)). Neudeck reviewed the impact of crystal (wafer) and epitaxy originated defects on power devices in 1994, highlighting limitations of power device function due to screw dislocations and morphological epitaxy defects (Neudeck, *Mat. Sci. Forum*, Vols 338-342, pp. 1161-1166 (2000)). Hull reported shift to lower values in the distribution of high voltage diode reverse bias leakage current when the diodes were fabricated on substrates having lower screw dislocation density (Hull, et. al., *Mat. Sci. forum*, Vol. 600-603, p. 931-934 (2009)). Lendenmann reported forward voltage degradation in bipolar diodes was linked to basal plane dislocations in the epilayer that originate from basal plane dislocations in the substrate (Lendenmann et. al., *Mat. Sci. Forum*, Vols 338-342, pp. 1161-1166 (2000)).

Modern technology for growth of 4H—SiC crystals has not been successful to develop a commercial method for a crystal growth process that allows simultaneous control over the gamut of dislocation types.

Various methods disclosed in the prior art are often lacking in details regarding the specific steps employed in the crystal growth or the methods employed to assess the concentration of defects and demonstrate repeatability.

In recent years, it has become desirable to grow larger crystals as silicon carbide and gallium nitride as such materials which are useful in building high efficiency power/RF diodes and transistor devices. However, large bulk crystals of silicon carbide (SiC) are difficult to grow, in part because such processes require high temperatures of up to 2,500° C. Currently, most growth processes utilize vapor-based transport methods such as physical vapor transport (PVT) sublimation methods.

For example, crystals of SiC may be grown by PVT in a reaction cell which is typically formed from solid graphite. The cell is typically a right angle cylinder and the grade of graphite is chosen so that its thermal expansion coefficient is close to that of SiC in order to minimize stresses imparted by the differences in the respective coefficients of expansion. The SiC seed crystal is typically provided in a disk shape. The seed crystal is polished and can be coated on the side opposite the growth surface with a material which is stable at the growth temperatures. The presence of a protective carbon coating can help to suppress deterioration of the seed during the crystal growth process, as voids ("thermal evaporation cavities") may form in the seed when the protection is absent.

The seed is generally oriented in the reaction cell so that the major axis of the cylindrical reaction cell and the plane of the seed wafer are nominally at right angles to each other. In most PVT reaction cells, the seed crystal is placed above the Si/C source feedstock to aid in controlling vapor flow as well as keeping the seed free of debris and contamination during growth. In this type of PVT reaction cell arrangement, the seed is typically supported above the vapor source by rigid or mechanical attachment of the seed to the lid of the reaction cell. The seed may be attached to the lid by adhesive, cement, retaining rings, and the like. However, the act of mounting the seed to the reaction cell lid or seed holder can lead to undesirable effects during crystal growth.

For example, during the mounting process, scratching of the coated seed back may occur. In addition, a void may be created between the seed and reaction cell ceiling interface during the mounting process. Such occurrences may exacerbate formation of evaporation cavities of the seed backside, resulting in defect formation. Moreover, differences in thermal expansion between the seed and lid can cause stresses in the seed. See, for example, discussion in Japanese patent publication JP 2011-20860.

It is important to support the seed crystal in the reaction cell in a position where the temperature can be controlled to allow condensation of the vapor stream on the seed surface. However, because the reaction cell is typically made from a different material than the seed crystal, the rigid attachment methods often create stresses in the crystal during growth. For example, when the seeds are mounted to the reaction cell or lid using an adhesive, it is possible for the seed to be bent during the mounting process, which results in undesirable stress in the crystal.

As a result, attempts have been made to develop alternative methods for supporting the seed crystal during growth. For example, JP 2011-20860 relies on pressure differentials to create vacuum that holds the seed against the lid. However, contact between the crystal and holder is such that stress on the crystal may still occur during growth. Specifically, pressure differential forces may deform the seed. Moreover, if the lid's surface is not smooth and flat, it will create pressure points on the back surface of the seed, thereby generating strains in the seed. Similarly, any particulate material that may inadvertently be captured between the seed and the lid would create pressure point. Even if the lid is perfectly flat such that the seed perfectly contacts the lid, when seed touches the lid it will cool the backside of the seed, causing it to bow away from the lid and the seal will be broken. Also, the bowing will cause the crystal to be in stress, leading to defects in the growing crystal.

There are other problems with the approach disclosed in the JP 2011-20860. For example, when the seed is elevated due to pressure differential, it blocks gas flow out of the crucible, thus leading to increased pressure and temperature inside the crucible. At least for these reasons it is preferred to maintain the flow of gas out of the crucible. Also, as the crystal grows it gets heavier and at some point will be too heavy for the pressure differential to maintain it against the lid, at which point the crystal would drop, leading to sudden change in the temperature of the crystal and due to resumed flow of gas out of the crucible, reduced pressure and temperature inside the crucible.

Accordingly, there is a need in the art for a method of SiC crystal growth, which results in crystal growth with minimized stress resulting in reduced defects such as micropipes, screw dislocations and basal plane dislocations.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Aspects of the present invention are directed to a method for supporting a seed crystal during vapor based crystal growth, and more particularly, to a vapor transport growth method wherein the seed crystal is not subjected to external stress during crystal growth.

Embodiments disclosed herein provide methods to produce a 4H—SiC crystal/wafer with micropipe density of less than $1/cm^2$, screw dislocation density of less than $5,000/cm^2$ and basal plane dislocation density of less than $5,000/cm^2$. All the defect metrics are achieved simultaneously.

According to disclosed embodiments, polytype 4H—SiC crystals can be grown using seeds of diameter as small as 76 mm or up to and exceeding 150 mm diameter.

Various aspects relate to a method of forming an SiC crystal by vapor transport onto a seed crystal, the method comprising: placing a source of silicon and carbon atoms in a graphite container, wherein the source of silicon and carbon atoms is for transport to the seed crystal to grow the SiC crystal; placing the seed crystal in the graphite container, and supporting the seed crystal on a shelf within the graphite container without physically attaching the seed crystal to any part of the graphite container; placing a lid over the container such that the lid does not contact the seed crystal and preventing the back surface of the seed from contacting the bottom surface of the lid during the entire processing cycle, and placing the graphite container in a vacuum furnace; heating the furnace to a temperature from about 2,000° C. to about 2,500° C.; evacuating the furnace to a pressure from about 10 Torr to about 100 Torr; and, maintaining the furnace to support crystal growth to thereby form the SiC crystal.

According to disclosed aspects a vacuum furnace is maintained to support crystal growth to thereby form the SiC crystal having a thickness of about 0.1 mm to about 50 mm thick, and wherein nitrogen flow is maintained such that nitrogen concentration of the grown SiC crystal is from about $1\times10^{15}/cm^3$ to about $1\times10^{19}/cm^3$.

Disclosed embodiments provide a 4H—SiC substrate cut from a SiC crystal and having an averaged micropipe density of less than about $1/cm^2$, a screw dislocation density of less than about $5,000/cm^2$, and a basal plane dislocation density of less than about $5,000/cm^2$ as determined from at least 9 measurements made on the 4H—SiC substrate.

Yet further aspects relate to a system for forming an SiC crystal, the system comprising: a graphite container having a lid and a shelf for positioning a seed thereupon; cushion rings allowing the seed to flex and expand while keeping the seed in the desired location relative to the cell and preventing the seed from contacting the lid during the entire growth cycle; a heater for heating an induction furnace to a temperature from about 2,000° C. to about 2,500° C.; a pump for evacuating the induction furnace to a pressure from about 10 Torr to about 100 Torr; and gas inlet for filling the induction furnace with an inert gas.

Other aspects relate to a graphite container for use in a furnace for performing SiC crystal growth on a disk-shaped seed having a known diameter, comprising: a graphite cylindrical container having a sidewall and an open top configured for accepting a graphite lid; a cylindrical shelf formed on an upper part of the sidewall and having an interior diameter slightly smaller than the diameter of the seed, the cylindrical shelf being formed at a defined distance below the open top, thereby enabling placing and supporting the seed thereupon and preventing the seed from contacting the lid during the entire growth process; and a graphite lid configured for forming a closure with the open top.

Additional aspects provide a method for forming an SiC crystal by vapor transport onto a seed crystal, the method comprising: placing a source of silicon and carbon atoms in a graphite container, wherein the source of silicon and carbon atoms is for transport to the seed crystal to grow the SiC crystal; placing the seed crystal in the graphite container and supporting the seed crystal such that a maximum stress resulting in the SiC crystal is less than $5 \times 10^6$ dynes/cm2; placing a lid over the container such that the lid does not contact the seed crystal during the entire growth process, and placing the graphite container in a vacuum furnace; heating the furnace to a temperature from about 2,000° C. to about 2,500° C.; evacuating the furnace to a pressure from about 10 Torr to about 100 Torr; and, maintaining the furnace to support crystal growth to thereby form the SiC crystal.

Other aspects and features of the invention would be apparent from the detailed description, which is made with reference to the following drawings. It should be appreciated that the detailed description and the drawings provides various non-limiting examples of various embodiments of the invention, which is defined by the appended claims.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

The following provides examples of fabrication methods according to embodiments of the invention, which result in substrates of relatively large diameter while exhibiting low micropipes, screw and basal plane dislocations densities. The apparatus and method employed are designed to exert no stress on the seed, so as to limit defects in the grown crystal. No clamping, bonding or mechanical attachments are used to retain the seed in place, and the seed is allowed to thermally expand without constraints, but the vertical movement is limited such that the back surface of the seed is prevented from contacting the surface of the lid. The following are specific embodiments illustrating how the seed can be retained in place without physically attaching it to the lid, although other embodiments may be used to achieve the same effect.

According to the following embodiments, the process begins with an SiC seed, which is generally in the shape of a circular wafer of the same diameter as the grown crystal. The seed crystals are polished and or etched on the carbon face to ensure that the surface is free of mechanical damage.

Embodiments of the method described herein provide several advantages over prior methods and apparatus for seed crystal growth. Most prior art methods connect the seed with contact between the back surface of the seed and the top of the crucible or reaction cell/lid. However, we have found that such contact is unnecessary and may be detrimental to crystal formation. We have unexpectedly found that by supporting a seed crystal in a configuration in which the seed is contacted only at its periphery, the stresses imparted to the crystal during growth are minimized. We have also unexpectedly found an improvement in the quality of the grown crystal as evidenced by the low crystal defect density.

This configuration of the support minimizes damage to or bending of the seed crystal during the mounting process, and because the seed crystal is mechanically decoupled from the reaction cell, the seed crystal may expand and contract independently of the reaction cell during growth.

Figure 1:
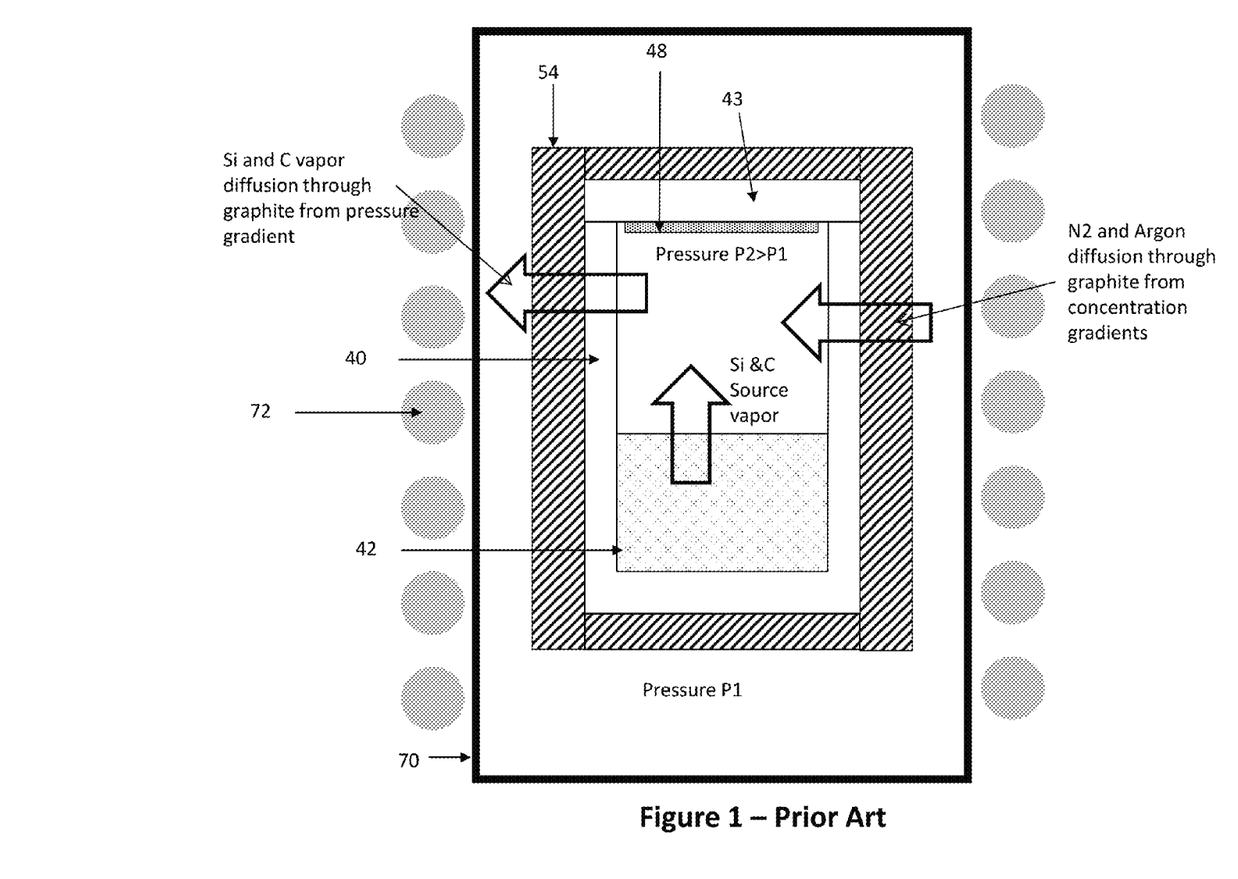
FIG. 1 shows a generic arrangement for growth of SiC crystals by physical vapor transport, indicative of the prior art.

FIG. 1 shows a generic arrangement for growth of SiC crystals by physical vapor transport, indicative of the prior art. PVT reaction cell 40 having lid 43 is illustrated which is configured for SiC crystal growth. The reaction cell is typically formed from a graphite vessel. Granulized SiC or silicon and carbon material 42 is placed in the bottom of the cell. Positioned in the upper portion of the vessel is a seed crystal 48 mounted to the inside of the top of the cell, e.g, clamped or bonded to lid 43. Notably, in the configuration of FIG. 1, during processing the back surface of the seed 48 contacts the bottom surface of the lid 43, whether by physical attachment, such as adhesive or clamp, or by pressure differential, as explained in JP 2011-20860.

The entire vessel is surrounded with insulation 54 such as graphite felt or foam. The reaction cell 40 is placed in a vacuum furnace 70 which is pumped by a vacuum pump. The vacuum furnace 70 may be comprised of steel if the cell is resistively heated, or it may be comprised of glass if the cell is inductively heated. In the embodiments shown, the vacuum furnace is comprised of glass and is heated by an RF induction coil 72. Silicon and carbon evaporate from the source material 42 and condense onto the seed 48. Silicon and carbon that has not condensed onto the seed is diffused out of the reaction vessel and into the vacuum furnace. This diffusion is driven by pressure gradient between the interior of the reaction vessel and the vacuum furnace. Gases that are being injected into the vacuum furnace, such as nitrogen, argon, and dopants, diffuse through the graphite crucible walls and into the reaction vessel. This diffusion is driven by concentration gradient between the vacuum chamber and the interior of the reaction vessel.

Figure 2:
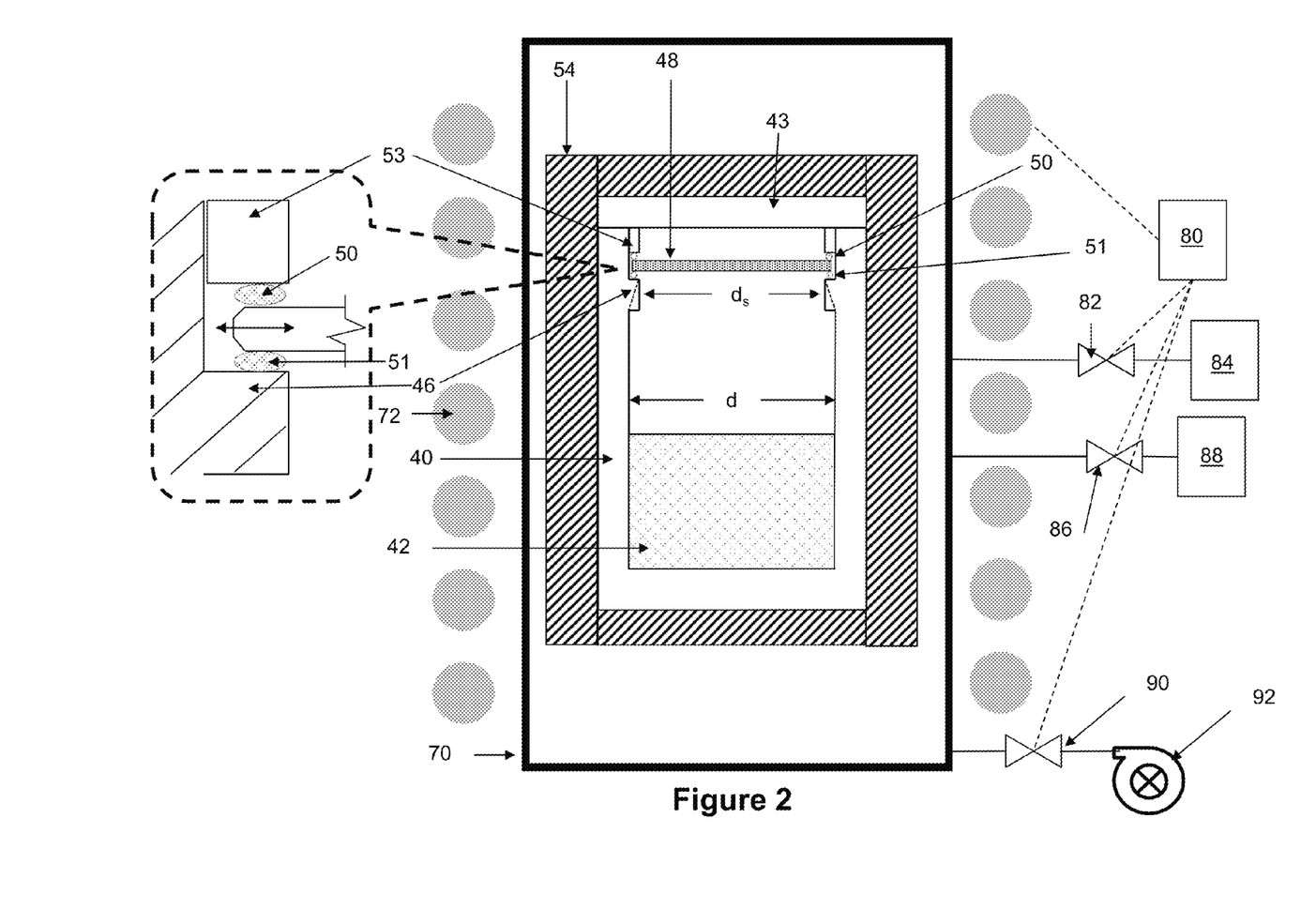
FIG. 2 shows a physical vapor transport PVT reaction cell, which is configured for SiC crystal growth according to one embodiment.

Referring now to FIG. 2, a PVT reaction cell according to one embodiment of this invention is illustrated, which is configured for low-stress, low-defect, SiC crystal growth. The reaction cell 40 is preferably formed from a graphite vessel and has lid 43. Granulized SiC or silicon and carbon material 42 is placed in the bottom of the cell. The cell has an interior diameter designated as "d" in FIG. 2, which is equal to or larger than the diameter of the seed 48. Additionally, a shelf 46 is provided in the upper portion of the cell. The shelf 46 has an inner diameter, designated "$d_s$" in FIG. 2, which is slightly smaller than the diameter of the seed 48. Of course, the walls of the shelf need not be vertical, but instead may be slanted, as shown by the dotted line, in which case the diameter "$d_s$" can have a larger value on the source side of the shelf than on the seed side. The shelf 46 can be made as a ring of graphite bonded to the sidewall of the vessel. Alternatively, the shelf 46 may be made integrally with the vessel, e.g., the vessel may be formed with the shelf as integrated part of the interior sidewall of the vessel 40.

Shelf 46 is used for supporting the seed crystal 48 at its peripheral edge, without any physical attachment. Rather, cushion rings 50, 51 are placed above and or below the seed, contacting the upper and lower surface of the seed 48 at its periphery. The cushion rings allow the seed to flex and expand while keeping the seed in the desired location relative to the cell and prevent the seed from physically contacting the lid 43 throughout the growth process. The cushion rings may be made of material that is softer than SiC, is malleable, and can withstand the process conditions and chemical reactions associated with SiC crystal growth. For example, molybdenum or graphite can be used to fabricate the cushion rings 50 and 51. Optionally, a graphite retainer, 53, is positioned above the upper cushion ring 50, so as to maintain the seed's vertical position and prevent the seed from contacting the lid. However, it should be appreciated that the upper ring 50 and retainer ring 53 need not press on the seed, but rather should allow free movement of the seed in the horizontal direction, as illustrated by the double-headed arrow in the callout. That is, the bottom cushion ring 51 is placed on the shelf 46, the seed 48 is then placed on top of the bottom cushion ring 51 and the top cushion ring 50 is placed on top of the seed 48. The retainer ring 53 is placed over the top cushion ring 50 and then the lid 43 is attached to the cell 40. This overall arrangement allows the seed to be in a controlled vertical position, and yet be free to expand and contract without creating stress in the seed upon heating and cooling. Finite element modeling shows that this geometrical arrangement to position the seed will correspond to a maximum stress in a bulk SiC crystal of less than $5 \times 10^6$ dynes/cm$^2$.

Figure 3:
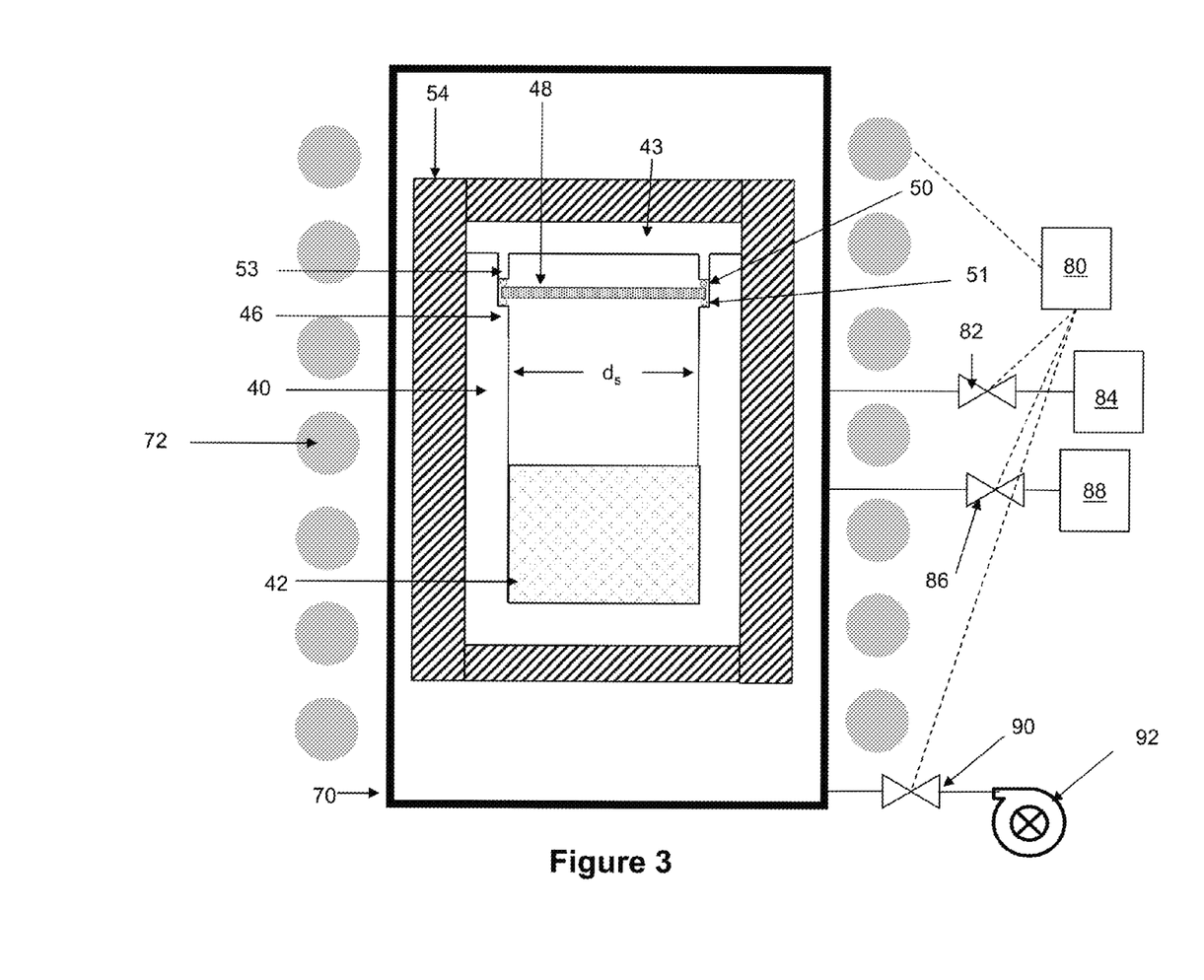
FIG. 3 shows a PVT reaction cell, which is configured for SiC crystal growth according to another embodiment.

FIG. 3 illustrates another embodiment for forming the shelf 46 as integral part of the cell 40. Specifically, the cell 40 is fabricated such that its interior diameter is slightly smaller than that of the seed 48, similar to diameter $d_s$ in the embodiment of FIG. 2. The upper part of the cell 40 is fabricated to have a diameter that is slightly larger than the diameter of seed 48, i.e., similar to diameter d in the embodiment of FIG. 2. The difference between the two diameters forms shelf 46, upon which the bottom cushion ring 51 rests. Thus, as can be understood, various configuration can be used to facilitate the shelf 46, and the particular configuration used is not essential, provided that the seed can be placed with the cushion rings on the shelf, such that the seed can expand and contract freely without having horizontal physical constraints, while at the same time preventing the seed rom physically contacting the surface of the lid 43.

The embodiment of FIG. 3 also illustrates making the retainer ring 53 as integral part of the lid 43. Specifically, as illustrated in FIG. 3, the lid 43 is fabricated with a protruding ring 53, serving to limit the vertical motion of the cushion ring 50, and thereby limiting the vertical motion of the seed 48. The ring 53 may directly contact the peripheral edge of the seed 48, or it may contact the cushion ring 50, when cushion ring 50 is used.

Figure 4:
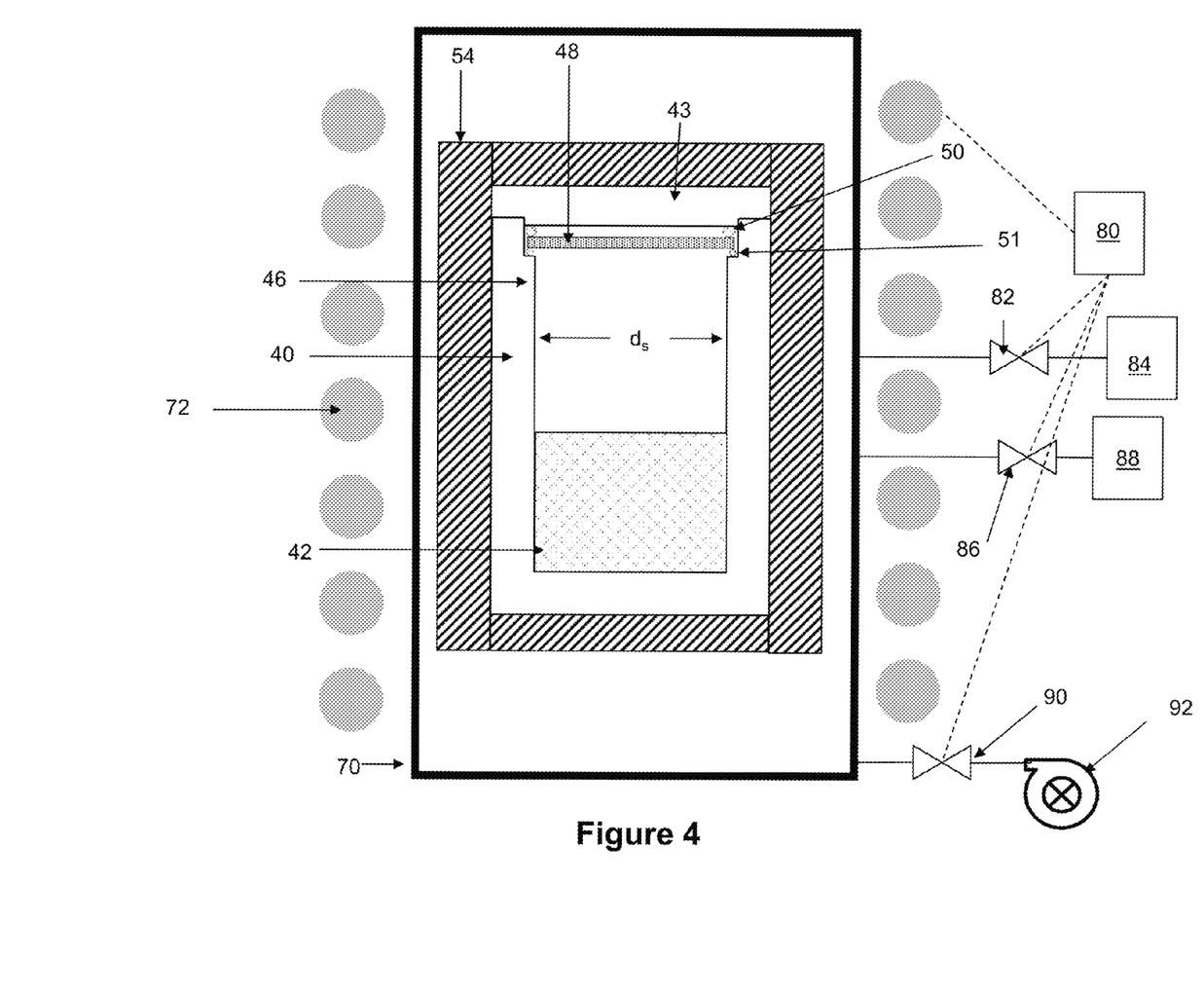
FIG. 4 shows a PVT reaction cell, which is configured for SiC crystal growth according to yet another embodiment.

FIG. 4 illustrates yet another embodiment for supporting seed 48 without imparting stresses and enabling free expansion and contraction. Specifically, the shelf 46 is fabricated close to the top opening of the cell 40, such that the retainer is not needed. Instead, the lid 43 serves to restrict the vertical motion of the upper cushion ring 50 by contacting the cushion ring 50, such that the seed cannot contact the surface of the lid 43. Another feature shown in FIG. 4 is the upper cushion ring 50 being thicker than the bottom cushion ring 51. This is done in order to keep the seed 48 sufficiently far from the lid 43 and reduce the thermal influence of the lid 43 on the seed 48.

The following description is applicable regardless of the specific embodiment utilized. The entire vessel is surrounded with insulation 54 such as graphite felt or foam. The thickness, thermal conductivity, and porosity of the insulation are chosen so as to achieve a desired temperature distribution in the reaction cell. The arrangement for growth of SiC crystals can include a controller 80 for controlling a valve 82 to dopant gas, e.g., a nitrogen source 84, which is connected to the vacuum furnace 70, and for controlling a valve 86 to an argon source 88, also connected to the vacuum furnace 70. The vacuum inside vacuum furnace 70 is controlled by valve 90 leading to vacuum pump 92. In this embodiment, controller 80 is configured to control vacuum valve 90 and pump 92 so as to maintain a user-set vacuum level inside the vacuum furnace 70, regardless of argon and/or nitrogen flow into the vacuum furnace. For example, if nitrogen flow into the chamber is increased, controller 80 opens the vacuum valve 90 to increase vacuum pumping from the furnace and maintain the set vacuum level. Controller 80 also controls the operation of the heater, such as the power applied to RF induction coil 72.

Once the cell 40 is loaded with the source material 42 and seed 48, it is sealed and is placed into an RF induction furnace 70. The furnace is evacuated using pump 92, thereby creating a pressure differential between the interior of the furnace 70 and the interior of the cell 40. However, cell 40 is constructed such that the lid does not seal the cell fully hermetically and so, gaseous matter from inside the cell 40 leaks to the interior of furnace 70 and is pumped out. Similarly, the walls of cell 40 are somewhat porous to gases and leak into the interior of furnace 70. Consequently, the pumping action of pump 92 also evacuates the interior of cell 40 by creating the pressure differential between the interior of cell 40 and the interior of furnace 70.

Once the interior of cell 40 and furnace 70 have been evacuated, the interior of furnace 70 is backfilled with a non oxidizing gas such as argon from argon source 88. Pressure is established near atmospheric pressure (500-700 torr) by controlling vacuum valve 90, and the container is heated to approximately 1,600-2,500° C. by energizing coils 72.

The pressure is subsequently reduced to initiate the vapor transport process. In this method, the pressure is first reduced to the range of 10-100 torr. Nitrogen gas can be added to the furnace to control the conductivity of the grown crystal, but regardless of nitrogen flow, the controller maintains the pressure at the set value, i.e., in the range of 10-100 torr.

At this point, the pressure, temperature and nitrogen flow are controlled to achieve the conditions needed to form the bulk SiC crystal on the seed. The thickness of the remaining crystal grown is in the range of 5-50 mm. Typical values of pressure are in the range of 0.1-10.0 torr and temperature in the range of 2,000-2,500° C.

At the end of the growth process, the pressure is raised to approximately 600 torr. This suppresses any more vapor transport. The furnace is then cooled to room temperature. When the container is opened, a single crystal of SiC with the same polytype as the seed crystal has formed on the seed crystal.

New seeds can be created by slicing the crystals grown by this method, and the new seeds can be used to grow new crystals. It is found that each generation of crystals grown shows reduced dislocation density.

As can be appreciated from the above, the method according to the disclosed embodiments involves holding a seed in a vapor transport reaction cell such that the stress imparted to the SiC crystal during growth is minimized to less than $5 \times 10^6$ dynes/cm$^2$ and, as such, the method can be integrated into any strategy to grow large crystals, e.g., having diameter larger than 76 mm and length longer than 25 mm.

To assess the dislocations in the crystal, the crystal is sliced and all slices are polished. Micropipes can be tested by first revealing them with molten salt etching and counting via manual and automated methods, or by scanning the polished slice with a laser light scattering spectrometer and an image processing algorithm to count the micropipes. Methods such as this are described in J. Wan, et. al., "A New Method of Mapping and Counting Micropipes in SiC Wafers" Proc. 2005 Intl Conf. On SiC and Related Materials, Materials Science Forum (2006), p. 447, and J. Wan, et, al., "A Comparative Study of Micropipe Decoration and Counting in Conductive and Semi-Insulating Silicon Carbide Wafers," J. Electronic Materials, Vol. 34 (10), p. 1342. Once the total number of defects is counted, this value is divided by the area of the slice measured to derive a defect density in counts per unit area.

Screw dislocations and basal plane dislocations require either molten salt etching as described above or x-ray topography. Counting is generally done by sampling several areas on the slice and counting the defects. The method typically used to report defects consists of a measurement at the center of the wafer, four sites 90 degrees apart at 50% of the wafer radius and four sites 90 degrees apart at >80% of the wafer radius, and rotated 45 degrees to the points at 50% of the radius. The total counts in each site are summed, and then the sum is divided by the measurement area to derive a defect density in counts per unit area. Since the sampling method of larger wafers is important to assessing the wafer, it is often pertinent to report the site count values as well as the net count of defects

EXAMPLE

A graphite vessel was formed and loaded with a source mixture of silicon and carbon totaling approximately 800 grams. A 4H-SiC seed of approximately 70 mm diameter was fixtured into the cell per the methods described earlier with the C-face facing the source. The graphite assembly was wrapped with graphite felt and placed into a RF induction heated vacuum furnace. The vacuum chamber was evacuated to base pressure and then backfilled with argon gas. The pressure was set to 600 Torr and the system was heated to achieve a temperature of approximately 2200° C. as read by a pyrometer focused on the lid of the graphite vessel. N2 gas was delivered to the chamber at this time and the pressure was dropped below 10 Torr to initiate sublimation of the source. The N2 gas flow was set to a level to deliver a nitrogen concentration in the crystal within the range 3-8E18/cm3. After about 100 hrs the pressure was raised to 600 Torr to stop sublimation and then the system was cooled to retrieve the crystal.

The resulting crystal, designated BH9013, was 19 mm long on the tapered side. Crystal was sliced into wafers which were offcut 4 degrees toward <11-20> and the wafers were polished using diamond abrasives to achieve a smooth specular surface.

Resistivity measurements performed on the wafers shows the values in the crystal ranged 0.016-0.026 ohm-cm.

One of the slices was etched in molten KOH to reveal the dislocations. Micropipes were measured by counting all the micropipes on the wafer and dividing by the wafer area. In this case 10 micropipes were identified and this corresponds to a micropipe density of $0.12/cm^2$. Dislocations were measured at 9 sites on the wafer arranged by radius and angle. The test locations consists of a measurement at the center of the wafer, four sites 90 degrees apart at 50% of the wafer radius and four sites 90 degrees apart at >80% of the wafer radius, and rotated 45 degrees to the points at 50% of the radius. Microscope images were taken at each site and the etch pit density ((EPD) which is the sum of all threading, basal and screw dislocations), basal plane dislocation density and screw dislocation density were determined from the images. The data is tabulated below:

| Site | EPD (cm−2) | Basal Plane Dislocation Density (cm−2) | Screw Dislocation Density (cm−2) |
|---|---|---|---|
| 1 | 1.25E+03 | 0 | 0 |
| 2 | 2.00E+04 | 500 | 0 |
| 3 | 2.50E+03 | 0 | 0 |
| 4 | 6.00E+03 | 250 | 0 |
| 5 | 1.50E+03 | 250 | 500 |
| 6 | 5.00E+03 | 0 | 0 |
| 7 | 5.25E+03 | 500 | 0 |
| 8 | 4.50E+03 | 0 | 0 |
| 9 | 0.00E+00 | 0 | 0 |

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A method of forming an SiC crystal by vapor transport onto a seed crystal, the method comprising:
  a. providing a graphite container having a cylindrical shelf formed on an upper part of an interior sidewall of the graphite container and having an interior diameter smaller than the diameter of the seed crystal, the cylindrical shelf being formed at a defined distance below an open top of the graphite container, and placing a source of silicon and carbon atoms in the graphite container, wherein the source of silicon and carbon atoms is for transport to the seed crystal to grow the SiC crystal;
  b. placing the seed crystal in the graphite container, and supporting the seed crystal on the cylindrical shelf within the graphite container without physically attaching the seed crystal to any part, wherein no clamping, bonding or mechanical attachments are used to retain the seed, and wherein the seed is contacted only at its periphery;
  c. placing a lid over the container such that the lid does not contact the seed crystal, and without physically attaching the seed to the lid, so as to allow free movement of the seed in the horizontal direction such that the seed is free to expand and contract upon heating and cooling, and placing the graphite container in a vacuum furnace;
  d. evacuating the furnace and establishing a flow of inert gas, and controlling the pressure at a value>600 torr
  e. heating the furnace to a temperature from 2,000° C. to about 2,500° C.;

f. evacuating the furnace to a pressure from 10 Torr to about 100 Torr;

g. controlling the pressure from 0.1 and 100 torr h. maintaining the furnace to support crystal growth to thereby form the SiC crystal, while preventing the seed from contacting the lid throughout the crystal growth process.

2. The method of claim 1, further comprising flowing nitrogen gas into the furnace.

3. The method of claim 2, wherein the furnace is maintained to support crystal growth to thereby form the SiC crystal having a thickness of about 0.1 mm to about 50 mm, and wherein nitrogen flow is maintained such that nitrogen concentration of the grown SiC crystal is from $1\times10^{15}/cm^3$ to $1\times10^{19}/cm^3$.

4. The method of claim 1, wherein the seed crystal is a 4H-SiC crystal having an offcut of 0 to 4 degrees toward (11-20) crystal orientation and wherein the nitrogen concentration of the seed crystal is from $1\times10^{16}/cm^3$ to $8\times10^{18}/cm^3$.

5. The method of claim 1, further comprising placing a cushion ring between the shelf and the seed.

6. The method of claim 1, further comprising placing a cushion ring between the seed and the lid.

7. The method of claim 1, wherein preventing the seed from contacting the lid comprises placing a retaining ring between the seed and the lid.

8. The method of claim 1, further comprising placing a bottom cushion ring between the shelf and the seed, placing an upper cushion ring between the seed and the lid, and placing a retaining ring between the upper cushion ring and the lid.

9. The method of claim 8, wherein the upper cushion ring is thicker than the bottom cushion ring.

* * * * *